United States Patent
Zhang et al.

(10) Patent No.: US 9,105,502 B2
(45) Date of Patent: Aug. 11, 2015

(54) INTEGRATED CIRCUIT COMPRISING ON-CHIP RESISTORS WITH PLURALITY OF FIRST AND SECOND TERMINALS COUPLED TO THE RESISTOR BODY

(71) Applicant: GLOBALFOUNDRIES Singapore Pte. Ltd., Singapore (SG)

(72) Inventors: Guowei Zhang, Singapore (SG); Purakh Raj Verma, Singapore (SG); Cho Khon, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/910,077

(22) Filed: Jun. 4, 2013

(65) Prior Publication Data

US 2013/0320497 A1 Dec. 5, 2013

Related U.S. Application Data

(60) Provisional application No. 61/655,999, filed on Jun. 5, 2012.

(51) Int. Cl.
| | |
|---|---|
| H01L 21/02 | (2006.01) |
| H01L 23/58 | (2006.01) |
| H01L 27/108 | (2006.01) |
| H01L 29/66 | (2006.01) |
| H01L 27/10 | (2006.01) |
| H01L 27/01 | (2006.01) |

(52) U.S. Cl.
CPC ............ *H01L 27/101* (2013.01); *H01L 27/016* (2013.01)

(58) Field of Classification Search
CPC ........................... H01L 27/016; H01L 27/101
USPC .................. 257/538, 312, 592, 343, 48, 380; 438/758; 338/308
See application file for complete search history.

(56) References Cited

U.S. PATENT DOCUMENTS

| | | | | |
|---|---|---|---|---|
| 6,320,241 | B1 * | 11/2001 | Okamoto ...................... 257/528 |
| 7,078,786 | B1 * | 7/2006 | Racanelli et al. .............. 257/536 |
| 7,633,373 | B1 * | 12/2009 | Johnson et al. ................ 338/195 |
| 2002/0070424 | A1 * | 6/2002 | Uenishi ......................... 257/536 |
| 2002/0180000 | A1 * | 12/2002 | Juang et al. .................... 257/536 |
| 2003/0157811 | A1 * | 8/2003 | Ukita ............................. 438/758 |
| 2004/0004535 | A1 * | 1/2004 | Banerjee ....................... 338/309 |
| 2006/0118908 | A1 * | 6/2006 | Erickson et al. .............. 257/536 |
| 2008/0030298 | A1 * | 2/2008 | Yang et al. .................... 338/308 |

* cited by examiner

*Primary Examiner* — Long K Tran
*Assistant Examiner* — Dzung Tran
(74) *Attorney, Agent, or Firm* — Horizon IP Pte. Ltd.

(57) ABSTRACT

An integrated circuit (IC) is disclosed. The IC includes a substrate with a resistor region and a resistor body disposed on the resistor region. A plurality of first resistor contact strips and a plurality of second resistor contact strips are disposed on the resistor body along a first direction. Two adjacent first and second resistor contact strips are separated by a respective one of contact strip spaces. The IC includes a plurality of first terminals and a plurality of second terminals. Each of the first terminals is coupled to a respective one of the first resistor contact strips while each of the second terminals is coupled to a respective one of the second resistor contact strips. A set of the first terminal and the second terminal forms first and second terminals of an on-chip resistor.

23 Claims, 4 Drawing Sheets

INTEGRATED CIRCUIT COMPRISING ON-CHIP RESISTORS WITH PLURALITY OF FIRST AND SECOND TERMINALS COUPLED TO THE RESISTOR BODY

CROSS-REFERENCE TO RELATED APPLICATION

This application claims the priority benefit of U.S. Provisional Application Ser. No. 61/655,999, filed on Jun. 5, 2012, which is herein incorporated by reference in its entirety.

BACKGROUND

Current sensing resistors are widely used in integrated circuits (ICs) to monitor the current in the circuit and translate the amount of current into a voltage that can be easily measured and monitored. Such resistors need to have low resistance value (in the range of 10 mΩ to 200 mΩ), low temperature coefficient of resistance (TCR, typically around 50 ppm/° C.), high current range (100 mA to 5 A, and typically around 1 A) and good heat dissipation. Current sensing resistors are implemented off the IC (e.g., off-chip). To accommodate the off-chip resistors, additional area is needed in the package or circuit board, increasing the overall foot print of the IC. Furthermore, off-chip resistors have corresponding manufacturing cost. Accordingly, the issues associated with off-chip resistors increase overall manufacturing costs as well as design flexibility.

It is describable to provide device structures and methods that allow integration of off-chip current sensing resistors as part of the chip in a cost effective way.

SUMMARY

Embodiments generally relates to semiconductor devices. In one embodiment, an integrated circuit (IC) is disclosed. The IC includes a substrate with a resistor region and a resistor body disposed on the resistor region. A plurality of first resistor contact strips and a plurality of second resistor contact strips are disposed on the resistor body along a first direction. Two adjacent first and second resistor contact strips are separated by a respective one of contact strip spaces. The IC includes a plurality of first terminals and a plurality of second terminals. Each of the first terminals is coupled to a respective one of the first resistor contact strips while each of the second terminals is coupled to a respective one of the second resistor contact strips. A set of the first terminal and the second terminal forms first and second terminals of an on-chip resistor.

In another embodiment, an integrated circuit (IC) is presented. The IC includes a substrate with a resistor region and a resistor body disposed on the resistor region. The IC includes a plurality of first terminals and a plurality of second terminals coupled to the resistor body. A set of the first terminal and the second terminal forms first and second terminals of an on-chip resistor.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings, in which.

DETAILED DESCRIPTION

The present disclosure provides a cost effective solution to integrate a current sensing resistor in an integrated-circuit chip.

Figure 1A:
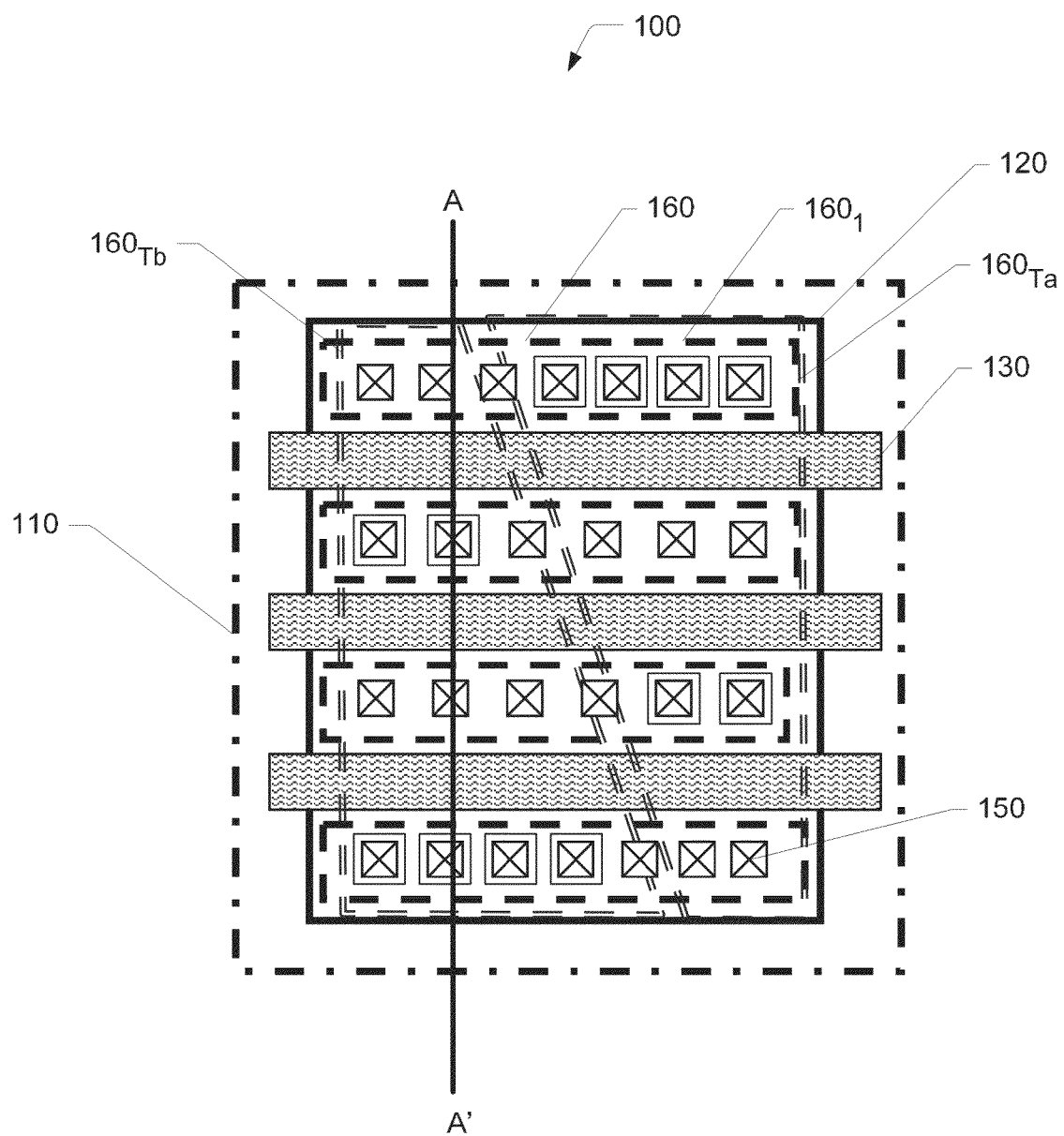
FIG. 1A is a top view of a resistor portion of a device in accordance with an embodiment of the present disclosure.
Figure 1B:
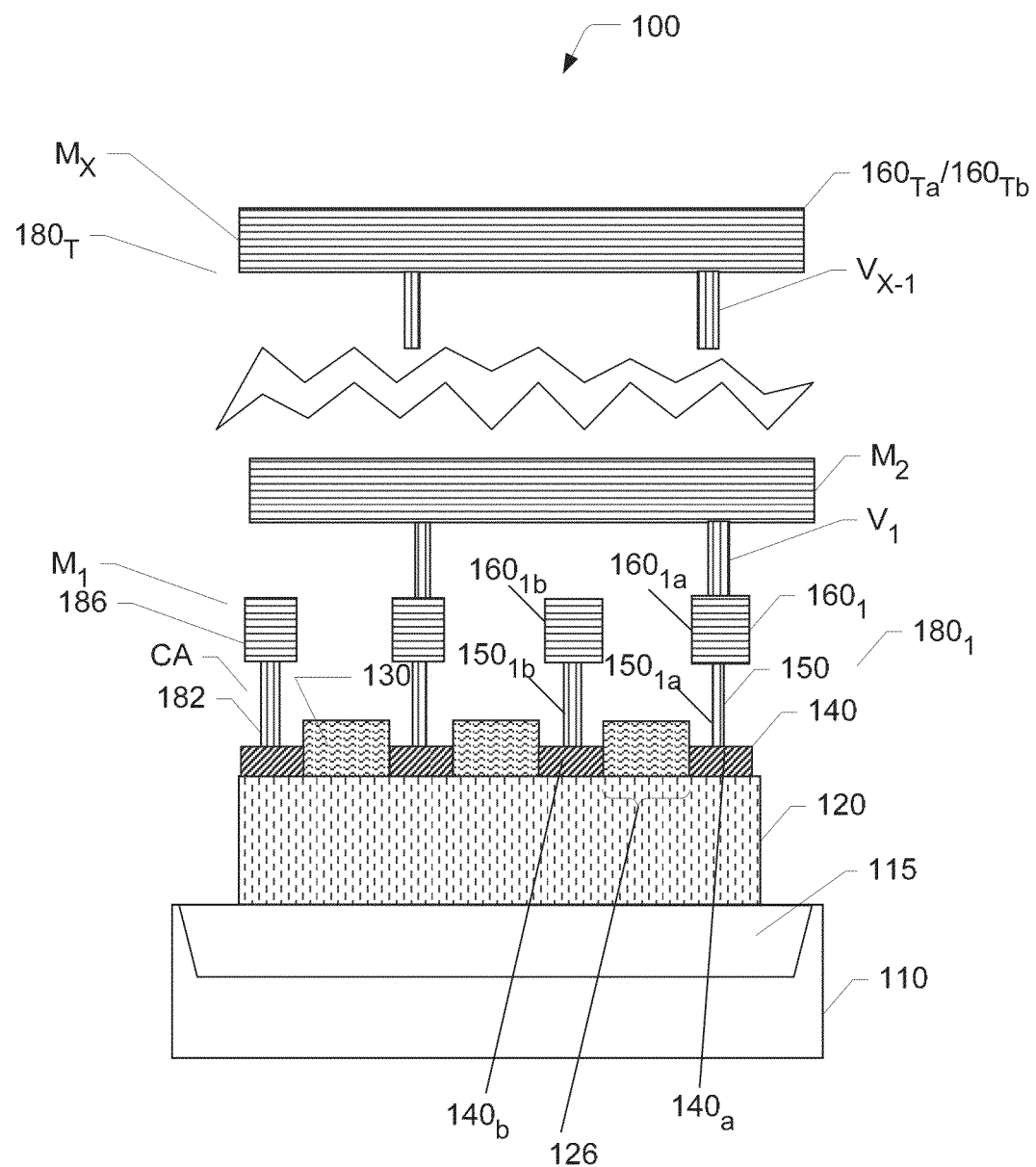
FIG. 1B is a cross-sectional view of the resistor portion of FIG. 1A along line A-A' in accordance with an embodiment of the present disclosure.

FIG. 1A illustrates a top view of a resistor portion of an embodiment of a device 100. FIG. 1B illustrates a cross-sectional view of the resistor portion of the device of FIG. 1A along line A-A'. The device, for example, is an integrated circuit (IC). The IC may be any type of IC. Other types of devices may also be useful. The IC may be incorporated into various types of consumer electronic products or other products.

Referring to FIGS. 1A and 1B, the device includes a substrate 110. The substrate may be a semiconductor substrate. For example, the substrate may be a silicon substrate. Other types of substrates, such as a silicon-on-insulator (SOI) substrate, may also be useful. The substrate includes a resistor region. For example, the resistor region serves as a region on which an on-chip resistor is disposed. The on-chip resistor, in one embodiment, is a thin film resistor. Although the portion of the device only shows a resistor region, it is understood that the device may include additional resistor regions. Furthermore, other regions may also be included. For example, the device may include a logic region. The logic region may include high voltage, medium voltage and/or low voltage regions. Other types of regions may also be included. For example, the device may include a memory region.

The resistor region includes an isolation region 115. The isolation region, for example, may be a trench isolation region, such as a shallow trench isolation (STI) region. Other types of isolation regions may also be useful. The trench isolation region may be formed by etching a trench (or recess) in a surface of the substrate and filling the trench with a dielectric material. Excess dielectric material may be removed by, for example, polishing, such as chemical mechanical polishing (CMP). The dielectric material of the trench isolation region may include silicon dioxide, silicon nitride, silicon oxy-nitride, and fluoride-doped silicate. Other types of dielectric materials may also be useful. The isolation region defines the resistor region.

A resistor body 120 is disposed in the resistor region. For example, the resistor body is disposed on and within the boundaries of the isolation region. The resistor body is formed of a thin film resistor material. Preferably, the resistor body is a thin film resistor material having a good TCR performance. For example, the resistor body has minimal resistance variation with changing temperature. The TCR value may be positive or negative depending on the type of resistor material used. A resistor with a positive TCR exhibits an increase in resistance with increasing temperature, while a resistor with a negative TCR exhibits a decrease in resistance with increasing temperature. The resistor body may be, for example, polysilicon, Ta, or TaN. In one embodiment, the resistor body is formed of heavily doped polysilicon. In one embodiment, the resistor body is formed of heavily doped p-type polysilicon ($P^+$ Poly). Providing a heavily n-doped polysilicon ($N^+$ Poly) resistor body may also be useful. Other types of resistor materials may also be used for the resistor body. As shown, the resistor body is rectangular in shape. Providing a resistor body with other geometric shapes may also be useful.

A plurality of resistor contact strip regions 140 are defined on the surface of the resistor body. The contact strip regions, for example, are disposed in parallel along a first direction. The contact strip regions are separated by space regions 130, creating distant contact strip regions. For example, the resistor body includes Y contact strip regions with Y-1 space regions, where Y is an integer greater than 1. In other embodiments, the number of contact strip is equal to $2^Y$, where Y is an integer number $\geq$ to 2. Other configurations of the resistor body may also be useful. Illustratively, the resistor body includes 4 contact strip regions and 3 space regions. The contact strip region includes resistor contact strips. The resistor contact strips may be made by the same material as that of the resistor body.

In one embodiment, the contact strip regions 140 include metal silicide contact strips. Metal silicide contact strips, for example, are provided for a silicon type resistor body, such as $P^+$ Poly. Providing metal silicide contact strips reduces contact resistance of polysilicon. Various types of metal silicides may be used. For example, nickel silicide, titanium silicide, cobalt silicide, tungsten silicide or platinum silicide may be used. As for the space regions 130, they include silicide blocks. Silicide blocks, for example, are dielectric blocks which prevent formation of metal silicide on the resistor block. Various types of dielectric materials, such as silicon oxide, silicon oxynitride, or silicon nitride, may be used.

Figure 2:
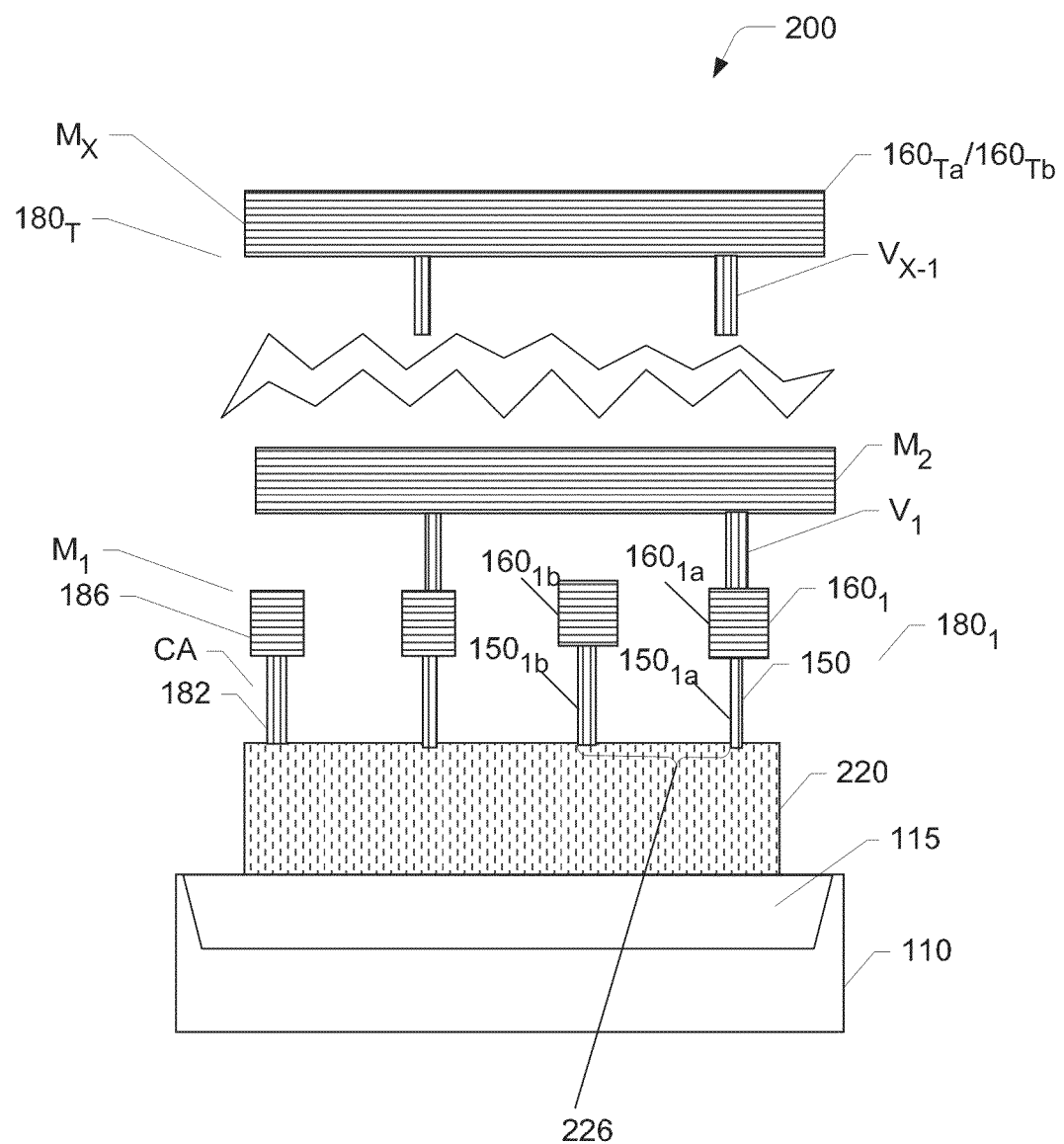
FIG. 2 is a cross-sectional view of a resistor portion of a device in accordance with another embodiment of the present disclosure.

In other embodiment, such as for metal-based resistor bodies, metal silicide contact strips may not be needed, as shown in FIG. 2. In such cases, the contact strips may be part of the resistor body. Furthermore, metal silicide blocks may not be needed since no silicide contact strips are used.

The metal silicide resistor contact strips may be formed by a self-aligned silicide (silicide) process. Other techniques for forming the resistor contact strips may also be useful. The process includes, for example, first forming silicide blocks in the space regions on the resistor body. For example blanket silicide block layer is formed on the substrate, covering the resistor body. Using a patterned mask layer, such as photoresist, the blanket layer is etched to form the silicide blocks. The etch, for example, may be an anisotropic etch, such as a reactive ion etch (RIE). As shown the silicide block extends beyond the resistor body to ensure that resistor body in the space regions is not exposed. A metal layer, such as nickel, titanium, tungsten, cobalt or platinum or alloys thereof, is disposed on the substrate, covering the resistor body and silicide block. The subsequent annealing causes a reaction between the metal and expose portions of the polysilicon resistor body to form metal silicide. No silicide is formed in the space regions of the resistor body due to the silicide blocks. Unreacted metal is removed by, for example, a wet etch, leaving metal silicide strips on the resistor body.

The resistor contact strips 140 are configured into first and second contact strips $140_a$ and $140_b$. A portion 126 of the resistor body between the resistors strips forms a resistor. For example, the portion of the resistor body below the silicide block forms a resistor. The first contact strip $140_a$ may serve as a first terminal of the resistor while the second contact strip $140_b$ may serve as a second terminal of the resistor. In the case where Y is an even number and greater than 2, such as 4 or greater, the resistor contact strips are configured into Y/2 sets of alternating first and second resistor contact strips $140_a$ and $140_b$. Portions between the resistor strips form Y-1 resistors. The final resistance of the resistor will be determined by the number of resistors formed which is in turn determined by the dimension (i.e., length and width) of the resistor body.

A dielectric layer is disposed on the substrate. The dielectric layer covers the substrate 110 and resistor body 120, including the resistor contact strips 140 and contact spaces 130. As shown, the dielectric layer covers the substrate and resistor body, including the silicide contact strips and silicide blocks. A dielectric layer serves as an interlevel dielectric (ILD) layer. The ILD layer includes a contact or via level 182 and an interconnect or metal level 186. Contacts 150 are disposed in the contact level 182 and metal lines 160 are disposed in the metal level 186. As discussed, an IC may include numerous metal levels. For example, an IC may include X metal levels, where X is the top metal level and 1 is the lowest metal level. For example, an IC may have metal levels $M_1$ to $M_X$. A dielectric or ILD layer corresponds to a metal layer.

The dielectric layer disposed over the substrate and resistor body, for example, is the first ILD layer $180i$. The first dielectric layer may also be disposed over other regions of the substrate. For example, the first dielectric layer may be disposed over transistors over other device regions of the substrate. The contact level of the first ILD layer may be referred to as the CA level while the metal level of the first ILD layer may be referred to as $M_1$. Conductive lines $160_1$ are disposed in the $M_1$. As shown, conductive lines are disposed in $M_1$ along the first direction over the resistor contact strips. In one embodiment, the conductive lines of $M_1$ are configured into sets of first and second conductive lines $160_{1a}$ and $160_{1b}$. The first conductive lines $160_{1a}$ are disposed over first resistor contact strips $140_a$ and second conductive lines $160_{1b}$ are disposed over second resistor contact strips $140_b$. First conductive contacts $150_{1a}$ in CA couples first conductive lines $160_{1a}$ in $M_1$ to first resistor contact strips $140_a$; second conductive contacts $150_{1b}$ in CA couples second conductive lines $160_{1b}$ in $M_1$ to second resistor contact strips $140_b$. Illustratively, a line is provided with 7 contacts which stitches or couples it to a respective resistor contact strip. Providing other number of contacts for a conductive line may also be useful. Preferably, a maximum number of contacts may be formed to reduce the contact resistance and to equally distribute the current flow across the resistor.

A terminal ILD layer $180_T$ is provided in which first and second main resistor terminals $160_{Ta}$ and $160_{Tb}$ are disposed. The main resistor terminals, as shown, are terminal plates. The terminal plates traverse the resistor body along a second direction. The second direction is, for example, orthogonal to the first direction. The second direction is, for example, parallel to A-A'. Adjacent sides of the terminal plates are separated by a space. The outer perimeter of the terminal plates together has a size and shape similar to the resistor body. For example, the terminal plates together have a size and shape which is about the same as the resistor body, although it can be slightly larger or smaller depending on the space allocated to the resistor on the device. Other configurations of terminal plates may also be useful.

The surface areas of the first and second terminal plates are equal. For example, the first terminal plate $160_{Ta}$ encompasses a first portion of the resistor body along the first direction and the second terminal plate $160_{Tb}$ encompasses a second portion of the resistor body along the first direction. The size of the first portion is the same as that of the second portion. The first main resistor terminal $160_{Ta}$ is commonly coupled to first conductive lines $160_{1a}$ of the M1 and the second main resistor terminal $160_{Tb}$ is commonly coupled to second conductive lines $160_{1b}$ of M1. This results in the resistors of the resistor body being coupled in parallel. For example, in the case of 4 contact strips which form three resistors, the three resistors are coupled in parallel.

Since the first terminal $160_{Ta}$ and second terminal $160_{Tb}$ of a resistor occupies opposite portions of the resistor body, current flow is slanted. In one embodiment, the adjacent sides of the terminal plates are slanted to compensate for the slanted current flow from one terminal of a resistor to the other. For example, the adjacent sides of the terminal plates are slanted at an angle following the direction of current flow of the resistor, forming trapezoidal shaped terminal plates. As shown, the wider end of the terminal plate is at the high current location and the opposite narrower end is at the lower current location. This reduces the sharpness of the angle of current flow. Providing slanted terminal plates improves current conduction capacity.

The use of slanted terminal plates results in different first metal lines having different amount of contacts and different second metal lines having different amount of contacts. For example, as shown, a first terminal of R1 has 4 contacts and the second terminal of R1 has 2 contacts while the first terminal of R2 has 2 contacts and the second terminal of R2 has 4 contacts.

In one embodiment, the terminal ILD layer is the top metal layer. For example, the terminal ILD layer is $M_X$. For intermediate ILD layers, such as for $M_2$ through $M_{X-1}$, the pattern may be the metal and via contact pattern which may be the same as $M_X$ until contact is made to conductive lines of $M_1$. Providing intermediate ILD levels with metal terminal plates in multiple metal levels increases heat dissipation generated by current flow. The main terminals are coupled to bond pads of the IC, enabling external access. For example, a first main terminal is coupled to a first bond pad and a second main terminal is coupled to a second bond pad.

As described, $M_1$ is provided for conductive lines coupled to the contact strips or directly to the conductive metal resistor body while $M_X$ serves as the terminal ILD layer. It is understood that other configurations of metal layers for various components of the resistor may also be useful. For example, conductive lines may be provided at $M_1$ and coupled directly or indirectly to the contact strips. Likewise, the terminal ILD layer may be any ILD layer above the metal levels of the metal lines. For terminal ILD layer below $M_X$, the main terminals may be coupled to bond pads directly or indirectly to the bond pads.

The size of the resistor body may depend on the technology node (e.g., 45 nm) as well as the material used and desired resistance. For example, technology node determines the CD of the resistor strips and spaces while different materials have different sheet resistances, and depending on the desired resistance, different number of resistors coupled in parallel may be required. As for the height of the resistor body, it may be similar to, for example, gates of transistors used in the logic area. Other configurations of resistor body may also be useful. As described, the resistor is compatible with current logic processes. This provides for easy integration of the resistor into the device or IC.

FIG. 2 illustrates a cross-sectional view of a resistor portion of a device 200 in accordance with another embodiment of the present disclosure. The same numeral references are used for those components similar or identical to those in the first embodiment illustrated in FIGS. 1A-1B, and the details described thereof is not repeated herein in the interest of brevity. In the present embodiment, when an electrically conductive material, such as metal like Ta and TaN for example, is used as the resistor body 220, no resistor contact strip regions 140 and space regions 130 as shown in FIG. 1B are needed. In this case, the contacts may be directly formed on the resistor body 220. As shown in FIG. 2, a resistor portion 226 of the resistor body 220 between the first conductive contacts $150_{1a}$ and the second conductive contacts $150_{1b}$ in contact level 182 forms a resistor.

The resistor of the present disclosure, as described, may be laid out in a multi-finger arrangement on one or several big plates connected in parallel so as to provide minimum process variation impact to the critical dimension (CD) of resistor body and the resistance value. With the multiple resistors of the multi-finger arrangement connected in parallel with respect to each other, a targeted resistor value can be achieved. Moreover, by connecting multiple thin film resistors in parallel, very small values of resistance can be achieved.

The resistor of the present disclosure may be simply integrated into the IC since the integration is compatible with current fabrication process. For example, the resistor body may be formed along with gates of transistors. In addition, various metal layers are made by the same materials as those of logic portion.

Figure 3:
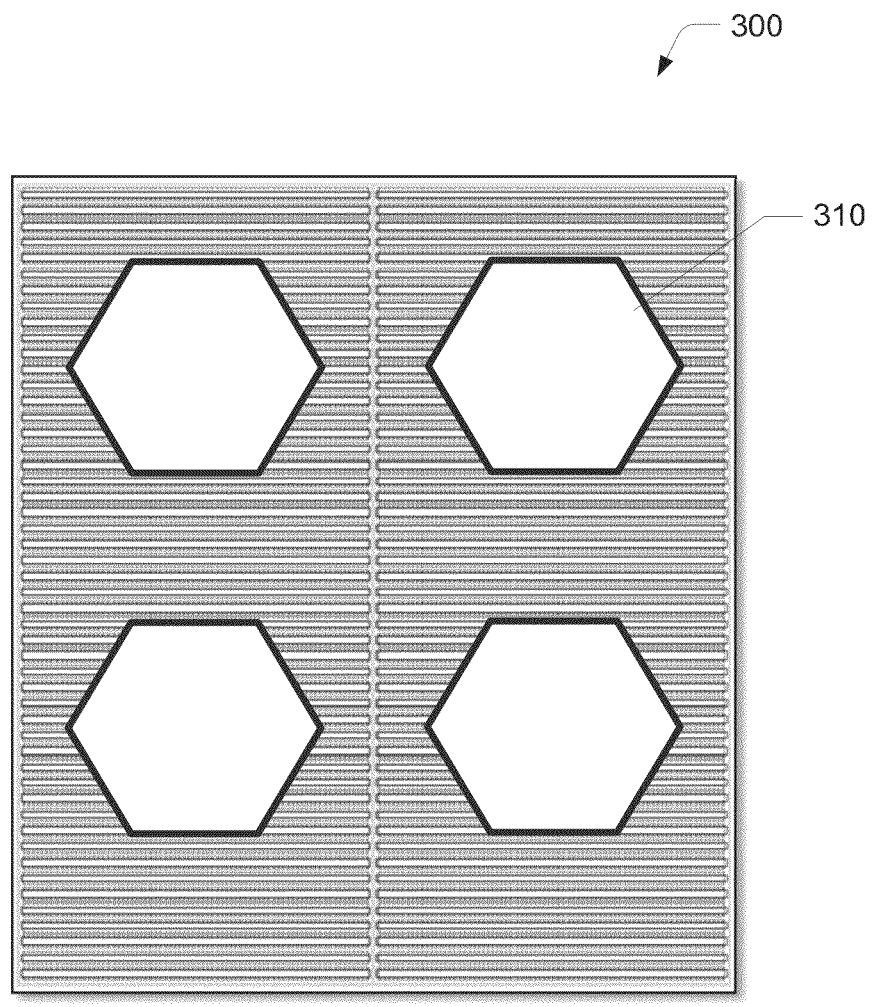
FIG. 3 is a top view of an integrated circuit layout including bond pad structures in accordance with an embodiment of the present disclosure.

FIG. 3 illustrates a top view of a layout of an integrated circuit 300 including bond pad structures 310 in accordance with an embodiment of the present disclosure.

The device 100 or 200 of the present disclosure may be integrated in an integrated circuit board 300 by a typical IC fabrication process. In one embodiment, the device 100 or 200 is disposed below bond pads 310 to reduce the integration area and cost. No additional chip area is needed to implement the on-chip resistor. Given that the device 100 or 200, which includes one or more current sensing resistor(s) as described above, is a part of an integrated circuit, the current of which is sensed by the current sensing resistor(s) in the device 100 or 200. As such, techniques of the present disclosure can be used to integrate any off-chip resistor into a chip in a cost effective way.

The device 100, having unsalicided P$^+$-Poly resistor, demonstrates very good TCR performance. Data listed in Table 1 below are taken from a 0.13 µm integrated-circuit fabrication process. The TCR performance of the device 100 of the present disclosure can meet TCR requirement for practical applications. An example of the device 100 of the present disclosure has an effective width ranging from 3,000 µm to 30,000 µm. Taking a typical poly current density of 1 mA/µm, the device 100 of the present disclosure can take up current ranging from 3 A to 30 A.

TABLE 1

| Characteristics of Current Sensing Resistors | | |
|---|---|---|
| Key Resistors | [Ω/Sq] | TCR1 [ppm/° C.] |
| P+ active resistor | 130 | 1500 |
| P$^+$ Poly Resistor | 315 | −50 |
| N$^+$ Poly Resistor | 300 | −1,100 |
| 1K HRES Poly Resistor | 1,000 | −1,000 |
| 2K HRES Poly Resistor | 2,000 | −1,050 |

To further improve TCR performance, a TCR compensation resistor may be provided. The TCR compensation resistor, in one embodiment, is coupled in parallel with the main resistor. The TCR compensation resistor has an opposite TCR as the main resistor. For example, if the main resistor has a positive TCR, the compensation resistor has a negative TCR. For example, if the main resistor is P$^+$-Poly, then the compensation resistor is N$^+$-Poly. In one embodiment, the compensation resistor has a small resistance. The compensation resistor effectively compensates for TCR while minimally impacting the overall resistance of the main resistor.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. An integrated circuit (IC), comprising:
a substrate with a resistor region, the resistor region includes an isolation region in the substrate;
a resistor body directly disposed on and contacts the isolation region;
a plurality of first and second contacts/vias formed on the resistor body, wherein a resistor portion of the resistor body between the first and second contacts/vias forms a resistor;
a terminal ILD layer disposed over the plurality of first and second contacts/vias; and
first and second terminal plates which are non-rectangular terminal plates disposed in the terminal ILD layer, wherein adjacent sides of the first and second terminal plates are separated by a space and adjacent sides of the first and second terminal plates are slanted and configured to encompass the same number of contacts/vias.

2. The IC of claim 1 comprising:
first and second alternating contact strips disposed on the resistor body along a first direction, wherein the first and second alternating contact strips serve as first and second resistor terminals;
contact strip space regions which comprise silicide blocks separating the first and second alternating contact strips; and
a separate dielectric layer disposed on the substrate, wherein the dielectric layer covers and contacts the substrate and the resistor body including the contact strips and contact strip space regions.

3. The IC of claim 2, wherein the contact strips comprise metal silicide contact strips.

4. The IC of claim 1, wherein the resistor body comprises polysilicon, Ta, or TaN.

5. The IC of claim 4, wherein the resistor body comprises heavily doped polysilicon.

6. The IC of claim 1, wherein an outer perimeter of the first and second terminal plates together has a size and shape similar to the resistor body.

7. The IC of claim 2, wherein the resistor body in the contact strip space region separating the first and second alternating contact strips forms a resistor.

8. The IC of claim 1, wherein the terminal plates are trapezoidal shaped terminal plates and are slanted at an angle following the direction of current flow of the resistor.

9. The IC of claim 2 comprising:
a plurality of first conductive lines disposed above a respective one of the first resistor terminals,
the plurality of first contacts/vias couple the respective one of the first resistor terminals to corresponding first conductive lines; and
a plurality of second conductive lines disposed above a respective one of the second resistor terminals,
the plurality of second contacts/vias couple the respective one of the second resistor terminals to corresponding second conductive lines.

10. The IC of claim 9, wherein:
the first terminal plate is coupled to the first conductive lines; and
the second terminal plate is coupled to the second conductive lines.

11. The IC of claim 10, wherein:
the first and second conductive lines are disposed on a first metal layer of the IC; and
the first and second terminal plates are disposed on a second metal layer of the IC.

12. The IC of claim 11, wherein the first metal layer is a lowest metal layer ($M_1$) of the IC and the second metal layer is a highest metal layer (Mx) of the IC, and x is an integer greater than 1.

13. The IC of claim 12, wherein one or more intermediate metal layers are disposed between $M_1$ and $M_x$, the one or more intermediate metal layers having a same pattern as that of the $M_x$.

14. The IC of claim 1, wherein the resistor is among a plurality of on-chip resistors that are coupled in parallel.

15. The IC of claim 1, wherein the on-chip resistor is disposed below a bond pad of the IC.

16. The IC of claim 10, wherein the non-rectangular terminal plates having adjacent sides which are slanted result in different first conductive lines having different amount of contacts/vias and different second conductive lines having different amounts of contacts/vias.

17. An integrated circuit (IC), comprising:
a substrate with a resistor region, the resistor region including an isolation region in the substrate;
a resistor body directly disposed on and contacts the isolation region;
a plurality of first contacts/vias coupled to the resistor body;
a plurality of second contacts/vias coupled to the resistor body, wherein a resistor portion of the resistor body between the first and second contacts/vias forms a resistor;
a terminal ILD layer disposed over the plurality of first and second contacts/vias; and
first and second terminal plates which are non-rectangular shaped terminal plates disposed in the terminal ILD layer, wherein adjacent sides of the first and second terminal plates are separated by a space and adjacent sides of the first and second terminal plates are slanted and configured to encompass the same number of contacts/vias.

18. The IC of claim 17, wherein the resistor body is a conductive metal comprising Ta, or TaN.

19. The IC of claim 17, wherein the portion of resistor body forming the resistor is below a silicide block.

20. The IC of claim 17, wherein an outer perimeter of the first and second terminal plates together has a size and shape similar to the resistor body.

21. The IC of claim 1, wherein the plurality of first and second resistor terminals contacts the resistor body.

22. The IC of claim 17 comprising:
first and second alternating contact strips disposed on the resistor body along a first direction;
contact strip spaces separating the first and second alternating contact strips; and
wherein the first and second alternating contact strips serve as first and second terminals of the resistor.

23. The IC of claim 17, wherein the plurality for first and second resistor terminals contacts the resistor body.

\* \* \* \* \*